United States Patent [19]

Maeguchi

[11] Patent Number: 4,498,224
[45] Date of Patent: Feb. 12, 1985

[54] METHOD OF MANUFACTURING A MOSFET USING ACCELERATED IONS TO FORM AN AMORPHOUS REGION

[75] Inventor: Kenji Maeguchi, Yokohama, Japan

[73] Assignee: Tokyo Shibaura Denki Kabushiki Kaisha, Kawasaki, Japan

[21] Appl. No.: 544,991

[22] Filed: Oct. 24, 1982

[30] Foreign Application Priority Data

Dec. 23, 1982 [JP] Japan ................. 57-232508

[51] Int. Cl.³ .......................................... H01L 21/425
[52] U.S. Cl. .................................... 29/571; 29/576 B; 148/1.5; 148/176
[58] Field of Search ............... 29/571, 576 B; 148/1.5, 148/176; 357/23 S

[56] References Cited

U.S. PATENT DOCUMENTS

| 4,344,222 | 8/1982 | Bergeron et al. | 29/571 |
| 4,383,869 | 5/1983 | Lui | 148/1.5 |
| 4,404,733 | 9/1983 | Sasaki | 29/571 |

OTHER PUBLICATIONS

Yamada et al., "Formation of Shallow P+N Junction by Low Temp. Annealing," Dig. 14th Conf. Solid State Physics, pp. 155-156 (1982).

Primary Examiner—Brian E. Hearn
Assistant Examiner—Hunter L. Auyang
Attorney, Agent, or Firm—Finnegan, Henderson, Farabow, Garrett & Dunner

[57] ABSTRACT

A method for manufacturing MOSFET type semiconductor devices comprises forming a gate insulation layer and a gate electrode on a single crystal semiconductor substrate; introducing impurities in the substrate using the gate electrode as a mask; introducing accelerated ions deeper into the substrate than the impurities and overlapping at least a portion of the region in which the impurities are introduced in order to convert that portion to an amorphous state; diffusing the impurities into the amorphous region using a heating atmosphere, in order to form source and drain regions and, at the same time, converting the amorphous region to a single crystal; and forming source and drain electrodes in contact with the source and drain regions.

8 Claims, 10 Drawing Figures

METHOD OF MANUFACTURING A MOSFET USING ACCELERATED IONS TO FORM AN AMORPHOUS REGION

BACKGROUND OF THE INVENTION

This invention relates to a manufacturing method for a MOSFET type integrated circuit having a relatively short channel, whose source and drain electrodes are connected electrically to source and drain regions in a semiconductor substrate.

A structure of a prior art MOSFET is shown in FIG. 1. The structure is formed using the following process: First, a thick insulation layer (2) made of $SiO_2$ is selectively formed on a P type semiconductor substrate (1) made of Si. A thin insulation layer and a polycrystalline silicon (Poly-Si) layer are formed on the exposed surface of the substrate (1). The thin insulation layer and the polycrystalline silicon layer are removed selectively through a photo engraving process, and become gate insulation layer (3) and gate electrode (4), respectively. N type impurities are implanted in substrate (1) using a mask on the gate insulation layer (3) and the gate electrode (4). The implanted N type impurities are activated in a heating step and source and drain regions (5) and (6) are thus formed. Next, an insulation layer (7) made of $SiO_2$ is deposited on the entire surface and contact holes (8) and (9) are formed by a photo engraving process. A layer of Al is deposited on the whole surface including the contact holes (8) and (9). The Al layer is patterned by a photo engraving process, selectively removed, and source and drain electrodes (10) and (11) are thus formed. In this process, the source and drain regions (5) and (6) must have a high concentration of impurities in order to obtain favorable ohmic contact with the Al electrodes. And it is desirable that the source and drain regions (5) and (6) are formed deeper. However, Al electrodes (10) and (11) can penetrate as a spike into the source and drain regions (5) and (6) by a eutectic reaction of Al and Si, make contact with the P type substrate (1), and destroy the function of MOSFET. And, the deeper source and drain regions (5) and (6) are formed using conventional processes, the more the diffusion of impurities in the lateral direction is increased. This increased lateral diffusion has the disadvantage of unnecessarily decreasing the effective channel length and prevents a fine structure from being achieved because the gate electrode must be formed larger to prevent this occurrence. This increased lateral diffusion also can cause the fluctuation of the threshold voltage because it is very difficult to control the extent of the diffusion in the lateral direction. Furthermore, the depletion layer of the drain region may reach the source region in a operating state, a "punch-through" phenomenon, and the MOSFET device may not operate with a predetermined characteristic.

Source and drain regions (5) and (6) can be formed shallower than those of FIG. 1 using prior art processes. In the resulting MOSFET device which is depicted schematically in FIG. 2, source and drain electrodes (10) and (11) still can reach the substrate (1) because they penetrate as a spike into the source and drain regions (5) and (6) as a result of the eutectic reaction of Al and Si. However, the sheet resistivity of the source and drain regions becomes high because these regions are formed shallower and cannot be formed with high concentration of impurities. Furthermore, when source and drain regions (5) and (6) are formed in a fine pattern using conventional processes, source and drain electrodes (10) and (11) can be formed with a gap in mask alignment, and this problem is depicted in FIG. 3. In this situation contact hole (9) may not be formed solely on the drain region (6) but may be formed on the intersection of the drain region (6) and substrate (1). As a result, drain electrode (11) can become shorted to substrate (1), and the MOSFET can lose its intended function.

SUMMARY OF THE INVENTION

It is accordingly an object of this invention to provide an improved method for manufacturing MOSFETS whose source and drain electrodes can be formed in a predetermined location relative to the source and drain regions.

Another object of this invention is to provide an improved method for manufacturing MOSFETS wherein the portion of the source or drain region in contact with the electrode is deeper than other portions of the source or drain region.

Another object of this invention is to provide an improved method for manufacturing MOSFETS that is suitable for forming "short channel" MOSFET devices.

In accordance with this invention, the improved method for manufacturing a MOSFET comprises the steps of forming a gate insulation layer and a gate electrode on a preselected portion of a semiconductive body of single crystal having a first conductivity type, introducing impurities into the semiconductive body using the gate electrode as a mask, introducing accelerated ions into the semiconductor body to overlap at least portion of the region in which the impurities are introduced, wherein the accelerated ions are partly introduced deeper than the impurities, to convert that portion of the crystal of the semiconductive body into an amorphous state, forming a diffused region having a second conductivity type,
and
forming an electrode on the diffused region.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DESCRIPTION OF THE PREFERRED EMBODIMENTS

Figure 1:
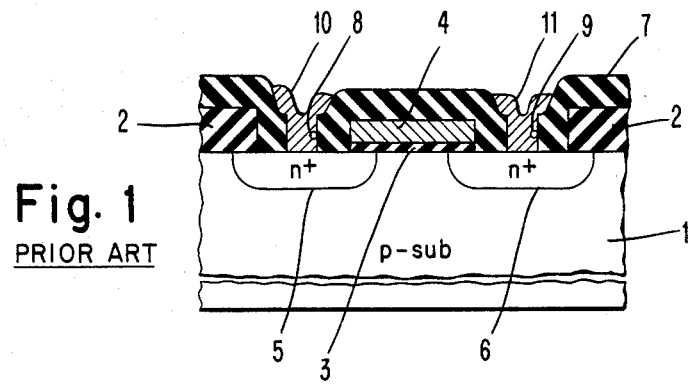
FIGS. 1 to 3 are sectional views of prior art MOSFET devices made using conventional processes.
Figure 2:
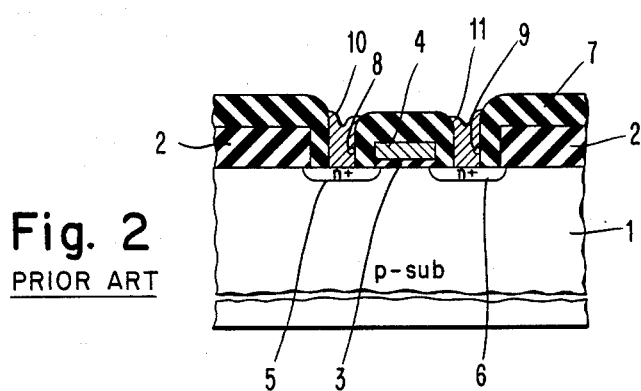
Figure 3:
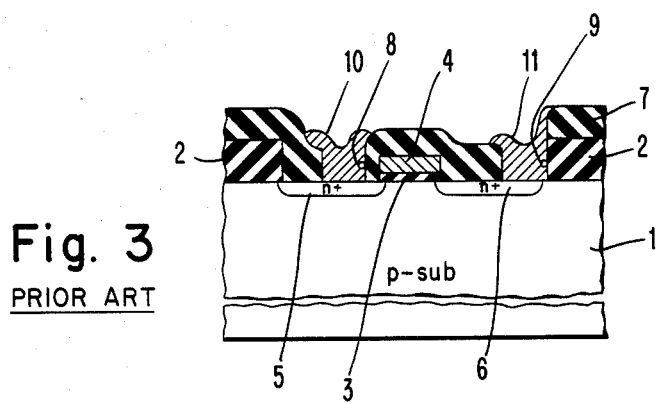

Referring now to the drawings, wherein like reference numerals designate identical or corresponding parts throughout the several views, and more particularly to FIGS. 4 to 8 thereof, wherein one embodiment of the method of manufacturing a MOSFET according to this invention is illustrated.

The manufacturing method according to this invention utilizes the phenomenon that the diffusion velocity of an impurity in an amorphous material is faster than that of the impurity in a single crystal of the same material. An insulation layer is applied to cover the region on which the first accelerated ions to convert the conductive type are deposited. Next, second accelerated ions are introduced into the substrate through contact holes formed in the insulation layer to overlap the first accelerated ion layer, to disorganize the crystal lattice in the overlapped portion whereby the substrate is converted from a single crystal to an amorphous state. After that, the first accelerated ions are activated and diffused in the substrate using a heating step. The resulting PN junction formed in the amorphous material is deeper than that in the single crystal because the impurities are diffused faster in the amorphous material than in the single crystal. In other words, PN junction in the semiconductor region under the contact hole is deeper than the PN junction formed in the semiconductor region close to the source-drain channel. Next, an Al layer is deposited in the contact holes to form source and drain electrodes. The electrodes are favorably contacted with portions of the source and drain regions having deep PN junctions, and the lateral diffusion to the channel region is very small because the source and drain regions close to the channel region are relatively shallow compared to the PN junctions in the electrode regions.

Figure 4:
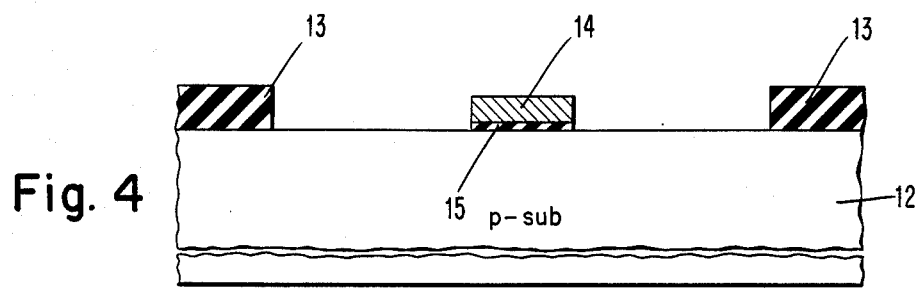
FIGS. 4 to 8 are sectional views of a MOSFET at various stages of construction according to a preferred embodiment of this invention.

A preferred embodiment is shown in FIGS. 4 to 8 and the following steps are used. First, a thick insulation layer made of $SiO_2$ is formed on a P type Si substrate (12) by a thermal oxidation technique. This insulation layer is selectively removed to form field insulation layer (13) as shown in FIG. 4. Next, substrate (12) is heated again and a thin insulation layer is formed on the exposed surface of the substrate (12), and a poly-Si layer including As as an impurity is deposited on the thin insulation layer in succession. The thickness of the thin insulation layer is about 500 Å. The poly-Si layer is then patterned and selectively removed to form gate electrode (14). The thin insulation layer is also patterned by using the gate electrode (14) as a mask to form gate insulation layer (15).

Figure 5:
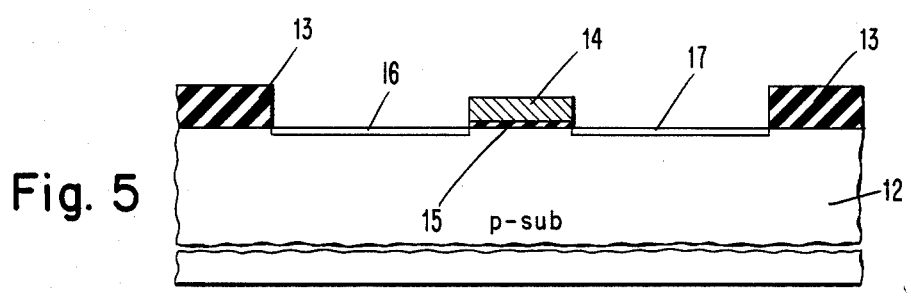

After that, accelerated impurity ions, for example As ions, are deposited on the exposed surface of the substrate (12), and As ion layers (16) and (17) are formed as shown in FIG. 5. Before this step, a very thin insulation layer (not shown) may be formed on the exposed surface of the substrate (12). In the latter case, the accelerated ions will be deposited through the very thin insulation layer. In the embodiment shown in FIG. 5, As ions are introduced with an acceleration voltage of 40 keV and a dose volume of $2 \times 10^{15}/cm^2$.

Figure 6:
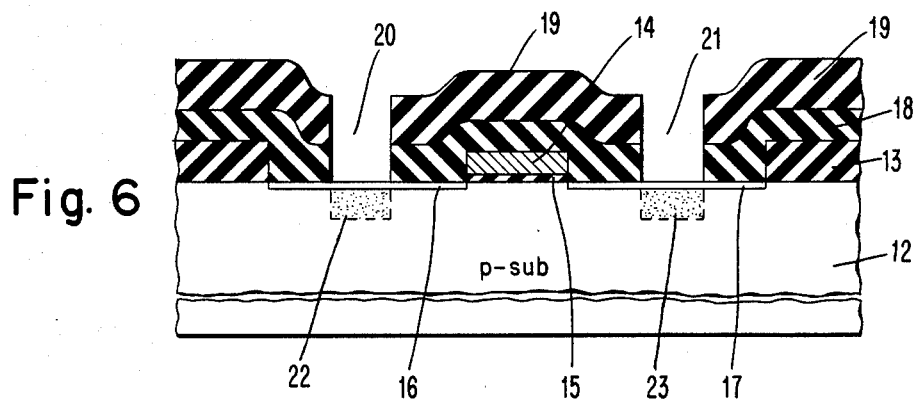
Figure 7:
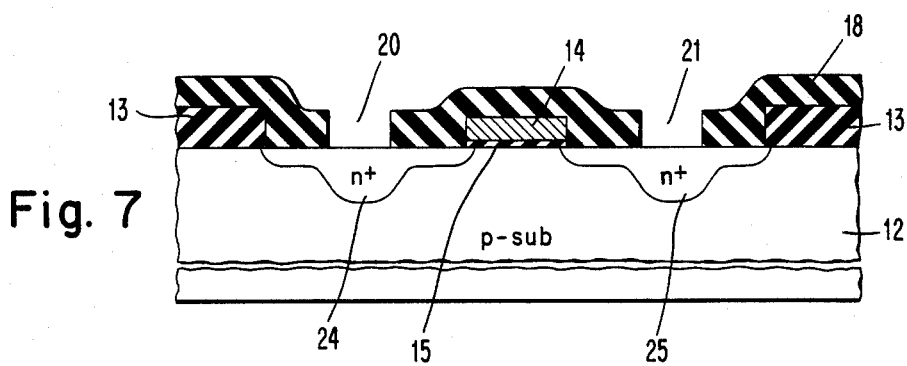

Following the impurity deposition step, insulation layer (18) made of $SiO_2$ is coated on the entire surface by chemical vapor deposition and photoresist layer (19) is coated thereon. Photoresist layer (19) is selectively removed through a photo engraving process to provide a pattern for forming contact holes. Insulation layer (18) is then selectively removed by using photoresist layer (19) as a mask and contact holes (20) and (21) are thereby formed. Next, accelerated Si ions are introduced into the substrate (12) through contact holes (20) and (21) with an acceleration voltage of 100 keV and a dose volume of $1 \times 10^{15}/cm^2$. The portions of the crystal of the substrate (12) in which Si ions were introduced are converted from a crystalline state to an amorphous state through this step and amorphous layers (22) and (23) are formed in the substrate (12) as shown in FIG. 6. Following the step of forming the amorphous layers, the photoresist layer (19) is removed, and the substrate (12) is heated at a temperature of about 700° C., whereupon a solidus growth advances from the single crystal layer, which acts as a seed crystal, into the amorphous regions, and the amorphous layers (22) and (23) are converted back to single crystal layers. At the same time, the N type impurities, As ions in this case, are activated and diffused into the substrate (12). The rate of difussion into the single crystal is slow, but the diffusion rate into the amorphous regions is much faster than that into the crystalline regions. Therefore, the PN junction in source and drain regions (24) and (25) becomes deep in the regions under the contact holes and remains shallow in other regions including the regions close to the channel region between source and drain regions (24) and (25) as shown in FIG. 7. At the temperature of about 700° C., essentially all of the As ions in the amorphous crystal are activated, but only a part of the As ions in the crystalline regions will be activated. Although the resistance value is high in the region in which the accelerated ions are not fully activated, it is more important to restrain the diffusion in the lateral direction toward the channel region. Moreover, the increase resistance value is not as important in this case because of the significant decrease in the resistance in the regions of contact with electrodes.

Figure 8:
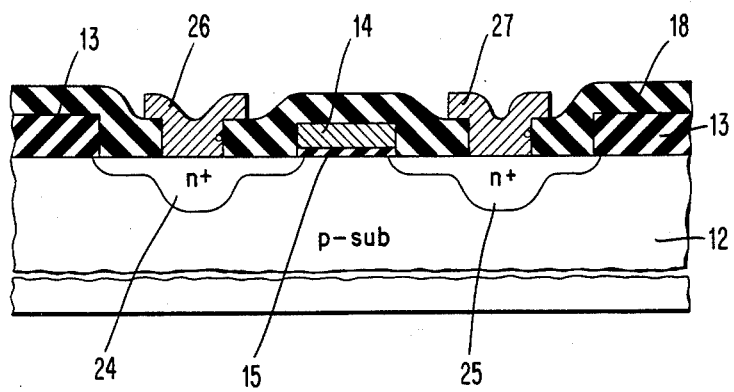

Following the heating step, an Al layer is evaporated on insulation layer (18) and into contact holes (20) and (21). The Al layer is then patterned by a photo engraving process and selectively removed, forming source and drain electrodes (26) and (27) as shown in FIG. 8. Because source and drain electrodes (26) and (27) are in contact with the deep regions of the source and drain regions, low ohmic losses result. According to the invention Al electrodes (26) and (27) are prevented from penetrating as a spike into the source and drain regions (24) and (25) and contacting the substrate (12) with the eutectic reaction of Al and Si. Because the total sheet resistance value in the source and drain regions is decrease, the MOSFET manufactured in accordance with the method of present invention can be operated at a high speed.

Undesirable effects which could otherwise appear in MOSFET's having a short channel construction, such as the fluctuation of the threshold voltage and the "punch through" phenomenon mention previously, can be prevented because the PN junction close to the channel region is shallow and unwanted lateral diffusion is decreased. Furthermore, according to this manufacturing process, the implanted ions can be activated at a relatively low temperature, so that the MOSFET can be manufactured with a low temperature process and the possibility of thermal degradation of the device can be reduced. Because contact holes (20) and (21) are formed from the As ion layers (16) and (17) using a precise mask alignment step, the amorphous layers (22) and (23), in which the impurities can diffuse at a faster rate, can also be formed directly under the contact holes (20) and (21). Thereafter, the impurities can be diffused quickly into amorphous layers (22) and (23) that are directly under the holes (20) and (21), and the possibility of a short between Al electrodes (26) and (27) and substrate (12) can be prevented.

Figure 9:
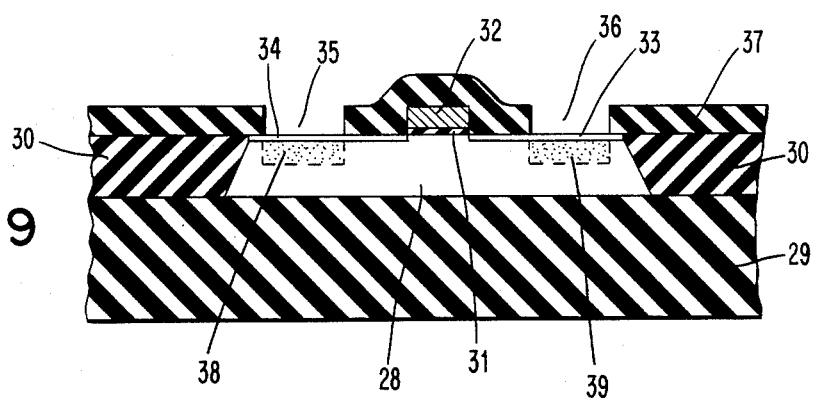
FIGS. 9 and 10 are sectional view of a MOSFET at various stages of construction according to another embodiment of the invention.
Figure 10:
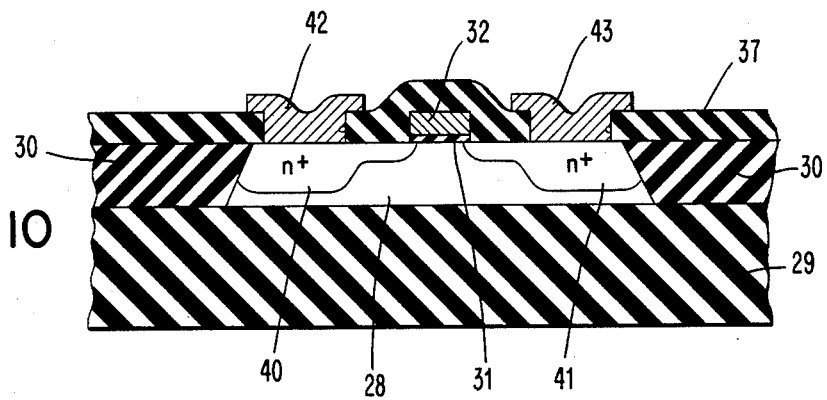

A MOSFET made according to another embodiment of the present process invention is shown in FIGS. 9 and 10. First epitaxial Si layer (28) is formed on sapphire substrate (29). Then, Si layer (28) is selectively oxidized by local oxidation step to form an $SiO_2$ field insulation layer (30). In order to control the threshold voltage of the MOSFET, accelerated boron ions are deposited in the region in which the channel regions of the MOSFET will be formed. Gate insulation layer (31) and gate electrode (32) are formed using the same process substeps as in the embodiment shown in FIGS. 4–8. Accelerated As ions are deposited on exposed Si layer (28) by using gate electrode (32), gate insulation layer (31), and field insulation layer (30) as a mask, and As ion layers (33) and (34) are then formed. Insulation layer (37) is then formed to cover Si layer (28), contact holes (35) and (36) are formed in layer (37), and accelerated Si ions are introduced into Si layer (28) through contact holes (35) and (36), again as in the previous embodiment. The accelerated Si ions convert impacted portions of Si layer (28) from a crystalline state to an amorphous state, and amorphous Si layers (38) and (39) are formed as shown in FIG. 9. Next the partially completed MOSFET is heated at about 700° C. to form source and drain regions (40) and (41), respectively. Source and drain regions (40) and (41) are shallow close to the channel regions and are deep in the regions under contact holes (35) and (36). Following the heating step, source and drain electrodes (42) and (43) made of Al are formed to contact the deep regions of source and drain regions (40) and (41) as shown in FIG. 10.

The MOSFET made according to the above-mentioned process has the same advantages as the first embodiment, and has the following additional benefits. Generally, Si layer (28) on the sapphire substrate (29) has many lattice defects which can shorten the lifetime of the carrier and increase the leak current of the device. But, in the present process the amorphous layers (38) and (39) are recrystallized in the heating step, and the resulting new crystal has fewer lattice defects, thereby decreasing the MOSFET leak current.

Although Si ions are used in the previously described embodiments to disorganize the crystal material to produce an amorphous state, ions of oxygen, nitrogen and so on can be used. It is preferable to use the same material as the substrate because the chemical stability of the substrate will be maintained. In addition, after the accelerated Si ions are deposited on Si layer (28) or Si substrate (12) through the contact holes, N type impurities, for example As, may be introduced through the same contact holes. By this additional process step, the possibility of a short circuit between the Al electrode and the substrate is virtually eliminated. Finally, the processes of this invention are also applicable to the construction of P channel type MOSFET's and complementary MOSFET's.

Obviously, many modifications and variations of this invention are possible in the light of the above teachings. It is therefore to be understood that within the scope of the appended claims, this invention may be practiced otherwise than as specifically described.

What is claimed is:

1. A method for manufacturing semiconductors of the MOSFET type comprising the steps of:
    forming a gate insulation layer and a gate electrode on a selected portion of a semiconductor body of single crystal material having a first conductivity type;
    introducing impurities of a second conductivity type into a preselected region of the semiconductor body using the gate electrode as a mask;
    introducing accelerated ions to overlap at least a portion of the region in which the impurities are introduced, wherein a fraction of the accelerated ions is introduced deeper than the impurities, said accelerated ion introducing step converting the crystal material of said semiconductive body portion into an amorphous state;
    forming a diffused region by diffusion of the second conductivity type impurities from said preselected region;
    and
    forming an electrode to contact the diffused region.

2. The manufacturing method according to claim 1, wherein the accelerated ions are Si ions.

3. The manufacturing method according to claim 1, wherein the diffused region has a shallow portion and a deep portion, and the electrode is formed to contact the deep portion.

4. The manufacturing method according to claim 1, wherein the accelerated ions are introduced through a hole in an insulation layer formed to cover said preselected region, said insulation layer having been formed after said impurity introducing step.

5. The manufacturing method according to claim 4, wherein the electrode is formed in said hole.

6. The manufacturing method according to claim 4 further comprising the step of introducing additional impurities through the hole, said additional impurity introducing step being accomplished after said accelerated ion introducing step and before said diffused region forming step.

7. A manufacturing method according to claim 1, wherein the semiconductive body is previously formed on a sapphire substrate.

8. The manufacturing method according to claim 1, wherein said diffused region forming step is carried out by heating the body to not more than about 700° C.

* * * * *